United States Patent [19]

Chang

[11] 4,122,537

[45] Oct. 24, 1978

[54] MAGNETIC BUBBLE CROSSOVER CIRCUIT

[75] Inventor: Christopher T. Chang, Dallas, Tex.

[73] Assignee: The United States of America as represented by the Secretary of the Air Force, Washington, D.C.

[21] Appl. No.: 729,634

[22] Filed: Oct. 5, 1976

[51] Int. Cl.² .............................................. G11C 19/08
[52] U.S. Cl. ........................................ 365/13; 365/39
[58] Field of Search .................... 340/174 TF; 365/13, 365/39

[56] References Cited

U.S. PATENT DOCUMENTS

| | | | |
|---|---|---|---|
| 3,676,873 | 7/1972 | Lee .................................. | 340/174 TF |
| 3,753,250 | 8/1973 | Yamauchi .............................. | 365/13 |
| 4,042,916 | 8/1977 | Chang .................................. | 365/13 |

Primary Examiner—James W. Moffitt
Attorney, Agent, or Firm—Joseph E. Rusz; Julian L. Siegel

[57] ABSTRACT

A crossover circuit for propagating magnetic domain bubbles in different directions under the drive of an in-plane rotating magnetic field. The crossover circuit includes intersecting vertical and horizontal elements and a pair of L combinations each having a vertical element and a horizontal element. The L combinations are linked to the intersection by a pair of inclined elements. There is also a short horizontal element and a short vertical element linked to the intersection by a second pair of inclined elements.

2 Claims, 6 Drawing Figures

MAGNETIC BUBBLE CROSSOVER CIRCUIT

STATEMENT OF GOVERNMENT INTEREST

The invention described herein may be manufactured and used by or for the Government for governmental purposes without the payment of any royalty thereon.

BACKGROUND OF THE INVENTION

This invention relates to magnetic bubble domain propagation, and more particularly to a crossover circuit for bubbles propagating in different directions.

The magnetic bubble domain technology uses tiny magnetic domains referred to as "bubbles" that can be made to appear, and and disappear, and rapidly move about particular crystalline magnetic materials under the control of magnetic fields. These materials can be formed into thin sheets with the easy axis of magnetization perpendicular to the sheet.

Controlled propagation is achieved by applying perturbations to the perpendicular bias field. The propagation field can be created by a pattern of easily magnetized and demagnetized material such as Permalloy activated by a rotating in-plane field. The bubbles behave like a magnetic dipole whose south pole is attracted to the north pole induced in the permalloy pattern by the in-plane field. The pattern transforms the rotation of the inplane field into a translating attractive pole pattern which guides the bubbles along the desired paths.

It is frequently necessary to propagate these domains to various storage locations requiring bubbles to move in different directions. It is necessary to provide mechanisms to enable crossovers of interconnections between storage locations.

The present invention presents an improved crossover circuit using inclined bars in a manner that permits a less complex geometry and allows the switching of the permalloy elements with greater simplicity. The use of shorter elements shifts the operation of these elements to a higher drive field and brings the operation of the crossover elements more in line with the propagating circuit.

SUMMARY OF THE INVENTION

An improved magnetic domain bubble track crossover circuit is presented in which bubbles can be propagated in different directions through the crossover circuit under the drive of a rotating in-plane magnetic field. The elements of the crossover circuit include inclined bars such as at 45° to permit the use of shorter elements. As a result, switching of bubbles upon the permalloy elements is made easier in response to the in-plane magnetic drive field. The shorter elements also shift the operation of these elements toward a higher drive field and bring the operation of the crossover element more in line with the propagating circuit which includes horizontal elements, vertical elements, and T-bar circuits each comprising a combination of a horizontal element and a vertical element.

It is therefore an object of this invention to provide a novel and improved crossover circuit that provides an intersection point of magnetic bubbles propagating in different directions.

It is still another object to provide a crossover circuit for magnetic bubble domain propagation permitting the use of shorter permalloy elements permitting easier switching by an in-plane rotating magnetic drive field.

These and other objects, features and advantages of the invention will become more apparent from the following description taken in conjunction with the illustrative embodiment in the in the accompanying drawings.

DETAILED DESCRIPTION OF THE PREFERRED EMBODIMENT

In FIGS. 1-6 it is shown how magnetic domain bubbles can be propagated in more than one direction when driven by a rotating in-plane magnetic field.

Figure 1:
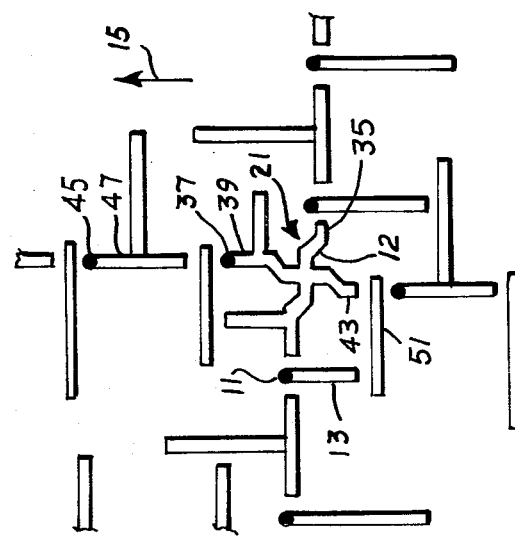
Figure 6:
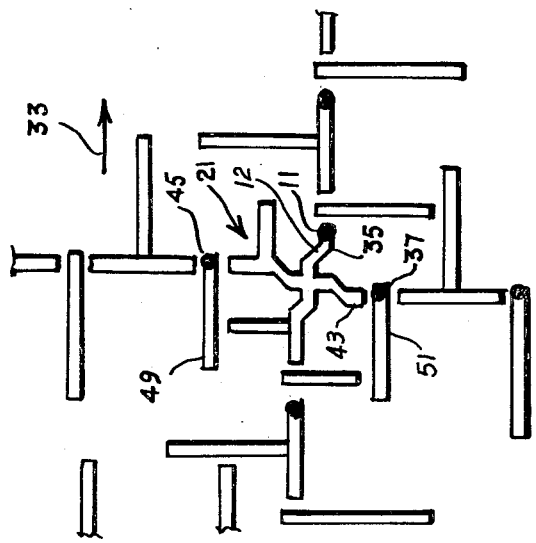
Figure 5:
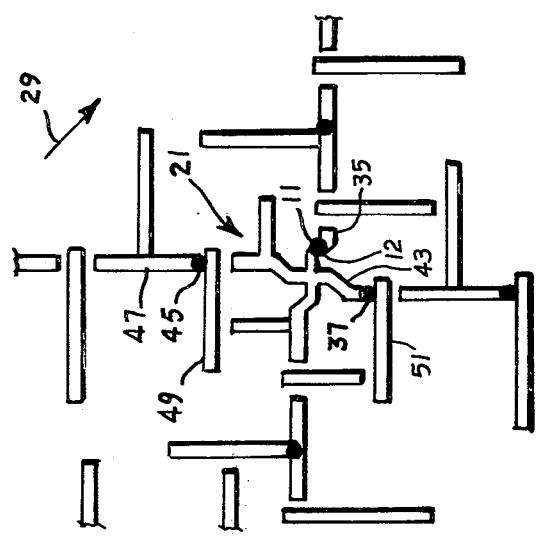
Figure 4:
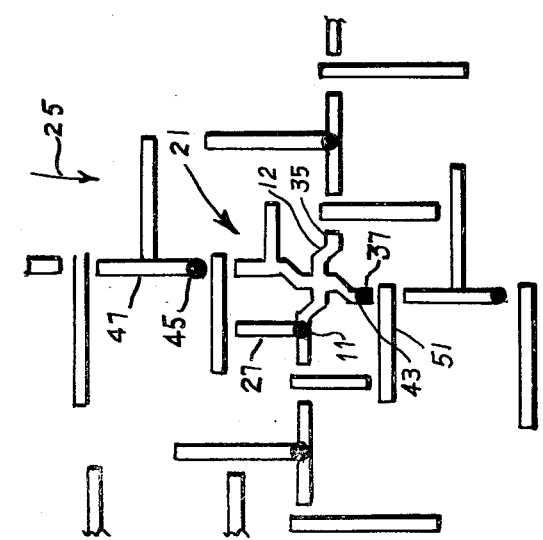

First examining bubble 11, it is seen to be located at the top of vertical element 13 in FIG. 1 because the direction of the in-plane magnetic field as shown by arrow 15 causes the top of element 13 to respond as a north pole. As the field shifts 90° as shown by arrow 17 in FIG. 2, the left side of horizontal element 19 of crossover circuit 21 acts as a north pole and causes bubble 11 to propagate to that position. The field has shifted another 45° in FIG. 3 as shown by arrow 23 but this has little effect on bubble 11 remaining in about the same position on horizontal element 19. In FIG. 4 the field has shifted another 45° as shown by arrow 25 causing the bottom of vertical element 27 to act as a north pole and attracting bubble 11 to that position. In FIG. 5 the rotating magnetic field has shifted another 45° as shown by arrow 29 causing the right portion of short horizontal element 12 at the junction of element 35 to respond as a north pole and attracting bubble 11 to that position. In FIG. 6 the rotating magnetic field has shifted another 45° as shown by arrow 33 causing the right portion of short horizontal element 35 to respond as a north pole and attracting bubble 11 to that position. Continuing the rotation of the in-plane magnetic field will cause bubble 11 to further move to the right in the customary manner.

Figure 3:
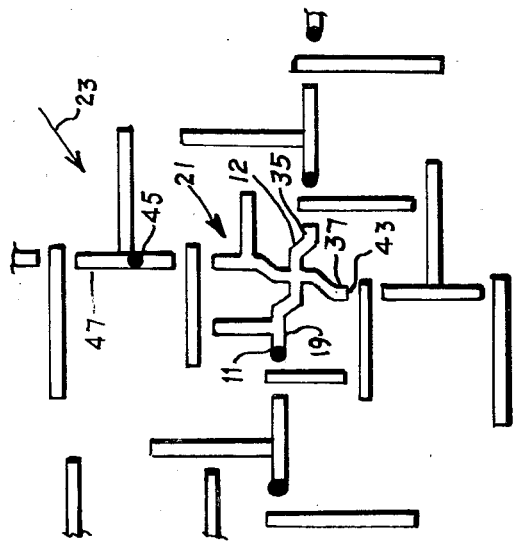
FIG. 1-6 are schematic diagrams showing the propagation of magnetic bubble domains as driven by a rotating in-plane magnetic field.
Figure 2:
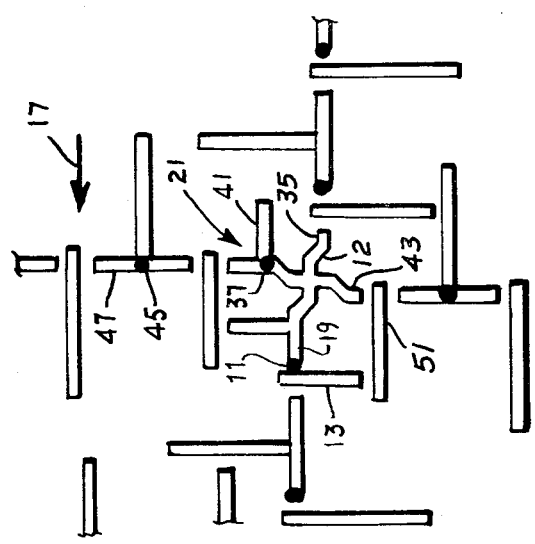

Now examining bubble 37 of FIG. 1, it can be seen to be located at the top of vertical element 39 of crossover circuit 21 due to the position of the in-plane rotating magnetic field as shown by arrow 15. In FIG. 2 the rotating magnetic field having shifted 90° as shown by arrow 17 has caused the left portion of horizontal element 41 to respond as a north pole and attract bubble 37 to that position. The rotating magnetic field has shifted 45° as shown by arrow 23 in FIG. 3 driving bubble 37 to short vertical element 43. The shifting of the magnetic field by another 45° denoted by arrow 25 of FIG. 4 has little effect on bubble 37. In FIG. 5 where the in-plane field has shifted another 45° as shown by arrow 29 bubble 37 has moved slightly. A further 45° shift of the rotating magnetic field as denoted by arrow 33 in FIG. 6 causes the right portion of horizontal element 51 to respond as the north pole and attract bubble 37 to that position. Continuing this rotation of the in-plane magnetic field will cause bubble 37 to move further in the downward direcgion in the customary manner.

Other bubbles can be seen to advance to crossover circuit 21 as driven by the rotating magnetic field such as bubble 45 which propagates down vertical element 47 in FIGS. 1-4 and in FIGS. 5 and 6 moves down to hirozontal element 49. Continued rotation of the magnetic field would cause bubble 45 to propagate through crossover circuit 21 in the manner of previously described bubble 37.

What is claimed is:

1. A magnetic bubble crossover circuit comprising:
   a. a substrate for propagating magnetic bubbles;
   b. means for generating a rotating magnetic field in the plane of the substrate;
   c. a plurality of magnetic elements positioned on the substrate to propagate magnetic bubbles across the substrate from different directions when driven by the rotating magnetic field;
   d. a common magnetic element positioned on the substrate to provide a crossover pattern for bubbles from different directions, the common magnetic element including,
      (1) a first vertical element,
      (2) a first horizontal element connected to the first vertical element at a connection point forming an L configuration,
      (3) a first inclined element connected to the connection point of the first vertical and the first horizontal elements,
      (4) a second horizontal element connected to the first inclined element,
      (5) a second vertical element intersecting the second horizontal element,
      (6) a second inclined element connected to the second vertical element,
      (7) a third vertical element connected to the second inclined element;
      (8) a third horizontal element connected to the second inclined element and the third vertical element with the third horizontal and third vertical elements forming an L configuration;
      (9) a third inclined element connected to the second horizontal element,
      (10) a fourth horizontal element connected to the third inclined element,
      (11) a fourth inclined element connected to the second vertical element, and
      (12) a fourth vertical element connected to the fourth inclined element.

2. A magnetic bubble crossover circuit according to claim 1 wherein the inclined elements are at 45°.